US010330832B2

(12) United States Patent
Wilson et al.

(10) Patent No.: US 10,330,832 B2
(45) Date of Patent: Jun. 25, 2019

(54) HIGH-LUMINANCE SURFACE

(71) Applicant: APPLE INC., Cupertino, CA (US)

(72) Inventors: James R. Wilson, Cupertino, CA (US); Matthew S. Rogers, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/750,710

(22) Filed: Jun. 25, 2015

(65) Prior Publication Data

US 2016/0377768 A1    Dec. 29, 2016

(51) Int. Cl.
| | |
|---|---|
| G02B 5/02 | (2006.01) |
| G02B 27/10 | (2006.01) |
| G02B 5/08 | (2006.01) |
| C25D 7/08 | (2006.01) |
| C23C 14/34 | (2006.01) |
| C03C 17/34 | (2006.01) |

(52) U.S. Cl.
CPC ........... *G02B 5/0289* (2013.01); *C03C 17/34* (2013.01); *C23C 14/34* (2013.01); *C25D 7/08* (2013.01); *G02B 5/021* (2013.01); *G02B 5/0294* (2013.01); *G02B 5/0816* (2013.01); *G02B 27/1006* (2013.01); *C03C 2204/08* (2013.01)

(58) Field of Classification Search
CPC .... G02B 5/0289; G02B 5/021; G02B 5/0215; G02B 5/0221; G02B 5/0231; G02B 5/0294; G02B 27/1006; G02F 2001/133331; G02F 1/133504; G02F 1/133553; G02F 1/133555; G02F 1/133606; G02F 1/133308; C03C 17/34; C03C 2204/08; C23C 14/34; C25D 7/08

USPC ......................................................... 359/599
See application file for complete search history.

(56) References Cited

U.S. PATENT DOCUMENTS

| | | | |
|---|---|---|---|
| 5,774,265 | A | 6/1998 | Mathers et al. |
| 6,813,094 | B2 | 11/2004 | Kaminsky et al. |

(Continued)

FOREIGN PATENT DOCUMENTS

| | | |
|---|---|---|
| CN | 101124273 | 2/2008 |
| CN | 102308231 | 1/2012 |

(Continued)

OTHER PUBLICATIONS

Eiden-Assmann et al., "Synthesis and Characterization of Porous and Nonporous Monodisperse Colloidal $TiO_2$ Particles," *Chem. Mater.*, 2004, vol. 16, pp. 6-11.

(Continued)

*Primary Examiner* — Marin Pichler
(74) *Attorney, Agent, or Firm* — Dorsey & Whitney LLP (57) ABSTRACT

A cover glass assembly comprises a sheet having a first surface and a second surface below the first surface. The second surface comprises a textured portion. The cover glass assembly also includes a pigment layer below the textured portion, and a mirror layer below the pigment layer. The textured portion diffusely reflects a first portion of light that enters the cover glass assembly through the first surface. The pigment layer diffusely reflects a second portion of the light. The mirror layer reflects, onto the pigment layer, a third portion of the light. The cover glass assembly provides a high-luminance surface. A method of forming the cover glass assembly is also disclosed.

19 Claims, 9 Drawing Sheets

(56) References Cited

U.S. PATENT DOCUMENTS

| | | |
|---|---|---|
| 6,842,282 B2 | 1/2005 | Kuroda et al. |
| 7,760,424 B2 | 7/2010 | Takeuchi et al. |
| 7,924,368 B2 | 4/2011 | Fabick et al. |
| 8,009,351 B2 | 8/2011 | Ando et al. |
| 8,384,630 B2 | 2/2013 | Ray et al. |
| 9,030,736 B2 | 5/2015 | Sadahiro et al. |
| 9,081,171 B2 | 7/2015 | Dean et al. |
| 10,114,237 B2 | 10/2018 | Wilson |
| 2003/0017316 A1 | 1/2003 | Pfaff et al. |
| 2004/0104663 A1 | 6/2004 | Umeya et al. |
| 2004/0166316 A1 | 8/2004 | Noguchi |
| 2005/0206020 A1 | 9/2005 | Baek et al. |
| 2007/0103799 A1 | 5/2007 | Chiang et al. |
| 2009/0015908 A1 | 1/2009 | Ando et al. |
| 2010/0330331 A1 | 12/2010 | Chiang et al. |
| 2012/0188295 A1 | 7/2012 | Joo |
| 2012/0218653 A1 | 8/2012 | Liu et al. |
| 2013/0133739 A1 | 5/2013 | Kohnke et al. |
| 2013/0183501 A1* | 7/2013 | Kasperchik ............ B41J 2/2103 428/207 |
| 2013/0194668 A1 | 8/2013 | Liang et al. |
| 2013/0199995 A1 | 8/2013 | Jiang et al. |
| 2014/0178647 A1 | 6/2014 | Kim et al. |
| 2014/0233161 A1 | 8/2014 | Liu |
| 2014/0295127 A1 | 10/2014 | Tang et al. |
| 2015/0062709 A1 | 3/2015 | Matsuyuki et al. |
| 2015/0234098 A1 | 8/2015 | Lofftus et al. |
| 2017/0068021 A1 | 3/2017 | Wilson |
| 2017/0075386 A1* | 3/2017 | Park ...................... G06F 1/1637 |
| 2017/0090084 A1 | 3/2017 | Wilson et al. |
| 2017/0139088 A1 | 5/2017 | Iki et al. |
| 2017/0174565 A1 | 6/2017 | Kase et al. |
| 2017/0321069 A1 | 11/2017 | Zhao et al. |

FOREIGN PATENT DOCUMENTS

| | | |
|---|---|---|
| DE | 102012109808 | 6/2014 |
| EP | 1170618 | 1/2002 |
| JP | 2002-240423 | 8/2002 |
| KR | 10-2013-0123000 | 11/2013 |
| KR | 101336936 | 12/2013 |
| WO | WO 01/03945 | 1/2001 |
| WO | WO 2010/096914 | 9/2010 |
| WO | WO 2015/086858 | 6/2015 |
| WO | WO 2016/006538 | 1/2016 |

OTHER PUBLICATIONS

Wang et al, "Rapid Microwave Synthesis of Porous $TiO_2$ Spheres and Their Applications in Dye-Sensitized Solar Cells," *The Journal of Physical Chemistry*, 2011, vol. 115, pp. 10419-10425.

Lou et al., "The Fabrication of $TiO2$ Porous Ceramic Structure," Journal of Shanghai Jiaotong University, No. 2, 314, Dec. 2007, pp. 306-309.

\* cited by examiner

HIGH-LUMINANCE SURFACE

FIELD

The subject matter of this disclosure relates generally to high-luminance surfaces and methods of making high-luminance surfaces.

BACKGROUND

The color of an object, such as an electronic device, may be selected for certain functionality. Some colors may be inherent in a material, such as the silver or grey color of aluminum. In other cases, inks, dyes, paints, or other coloring techniques are used to achieve a particular color. The luminance or brightness of a particular colored surface depends on many factors, such as the relative amount and spectral content of the light that is reflected and absorbed by the surface, whether the surface is glossy or matte, and the like.

SUMMARY

Described herein are structures with high-luminance surfaces, as well as methods of making structures with high-luminance surfaces. For example, as described herein, including textured surfaces and mirror layers in a structure (e.g., a cover glass assembly) may increase the proportion of light reflected by the structure.

Some embodiments of a cover glass assembly comprise a sheet comprising a first surface and a second, textured surface opposite to the first surface. The cover glass assembly also includes a pigment layer below the textured surface. The textured surface diffusely reflects a first portion of light entering the sheet through the first surface, and the textured surface diffusely transmits, onto the pigment layer, a second portion of the light.

Some embodiments of a cover glass comprise a transparent region, a textured region adjacent to and framing the transparent region, a pigment applied to the textured region, and a mirror layer adjacent the pigment. The textured region increases a luminance of the pigment.

A method of forming a cover glass assembly comprises forming a textured portion on a bottom surface of a sheet, where the textured portion corresponds to a frame portion of the cover glass assembly. The method further comprises applying a pigment layer to the textured portion of the sheet, and applying a mirror layer to the pigment layer. The textured portion is configured to diffusely reflect a portion of light that enters the cover glass assembly through the sheet.

An electronic device comprises a housing, a display device coupled to the housing, and a cover glass assembly coupled to the housing. The cover glass assembly comprises a sheet comprising a textured portion. The cover glass assembly also comprises a pigment layer below the textured portion, and a mirror layer below the pigment layer. The cover glass assembly defines a substantially transparent portion covering the display device and a substantially opaque portion forming a frame around a portion of the display device. The textured portion corresponds to the frame.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The term "luminance" refers to a photometric measure of luminous intensity per unit area of light being emitted from a surface (in the case of light-emitting objects such as a lightbulb) or being reflected from a surface (in the case of objects that rely solely on reflected light in order to appear luminous). The term "luminance" may also be used to describe the subjective "brightness" of a surface as observed by a user. For example, for reflective surfaces, a surface that has a higher luminous intensity under a given lighting condition may appear to a user to be "brighter" (e.g., higher luminance) than another surface that has relatively lower luminous intensity. As used herein, the term "luminance" may refer both to the photometric measure of the luminous intensity per unit area, as well as a subjective "brightness" of the surface.

Accordingly, described herein are high-luminance structures, components for use in high-luminance structures, and methods of making the same. For example, a structure may include multiple layers, including one or more layers of pigment covered by a cover glass. The pigment alone may provide a relatively high luminance value for the structure; for example, a titanium dioxide-based pigment may reflect as much as 92% of the light that strikes the pigment. However, as described herein, the luminance of the structure (or indeed any component that includes a layer of pigment beneath a cover glass) may be increased by applying a texture, such as an array of indentations or other surface irregularities, to a portion of the cover glass that is adjacent to the pigment. This textured surface may increase the extent to which the structure reflects and/or diffuses light, which may increase the luminance of the structure. Various techniques may be used to form the textured surface, and the textured surface may have multiple different configurations, as described herein.

Additionally, structures may include a mirror layer below the pigment layer(s) to increase reflectivity of light and conceal structures or objects beneath the structure. The mirror layer may be a substantially mirrored surface, coating, or material that redirects any light that passes through the pigment layers back onto (and/or through) the pigment layer. The foregoing techniques may be used either independently or together to increase the luminance of a surface.

While the high-luminance surfaces described herein may be useful for many different types of objects, one example use is in an electronic device. For example, portions of the outer surfaces of a handheld electronic device, such as a smartphone or tablet computer, may be colored. As a specific example, a portion of a cover glass that surrounds a display of a smartphone may be coated or otherwise treated with a pigment of a certain color. This pigment may be used to obscure internal components of the device, while also delineating the area of the display. While the present disclosure describes the high-luminance surfaces in the context of an electronic device, it will be appreciated that the same methods, materials, and components may be used in any other appropriate object.

Figure 1A:
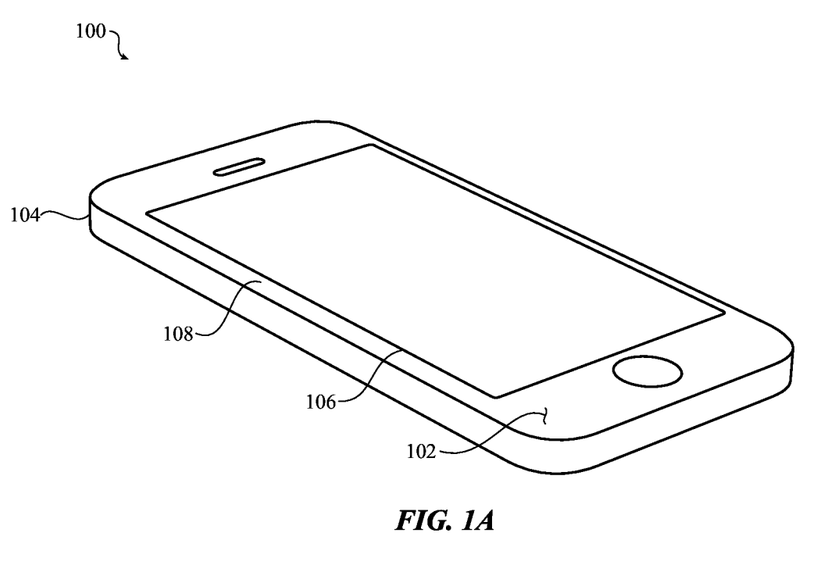
FIG. 1A shows an example of an electronic device.

FIG. 1A shows an example electronic device 100 embodied as a smartphone. While the device 100 is a smartphone, the concepts presented herein may apply to any appropriate electronic or non-electronic device, including wearable devices (e.g., watches), laptop computers, handheld gaming devices, tablet computers, computing peripherals (e.g., mice, touchpads, keyboards), or any other device.

The electronic device includes a cover glass assembly 102, which may be formed from and/or include multiple layers. The cover glass assembly 102 is attached to a device housing 104 using an optically transmissive adhesive or other bonding technique. For example, the cover glass assembly 102 may be attached to the housing 104 using a pressure sensitive adhesive film. The cover glass assembly 102 may cover a display device 106 so as to protect the display device 106 from scratches, impact, breakage, or other physical damage.

In some embodiments, the cover glass assembly 102 includes a frame 108, which may be defined by one or more pigment layers 116 (FIG. 1C) of the cover glass assembly 102. The frame 108 may cover and/or obscure internal components of the electronic device, as well as frame the display device 106. In some embodiments, the cover glass assembly 102 includes a textured surface and a mirrored layer in the area corresponding to the frame 108, as described herein, to increase the luminance of the frame 108.

The frame 108 includes a border adjacent each side of the display device 106. In some embodiments, however, the display device 106 includes fewer borders. For example, the device 100 may include a top border adjacent a top of the display device 106 and a bottom border adjacent a bottom of the display device 106. Alternatively, the device may include a left border adjacent a left side of the display device 106 and a right border adjacent a right side of the display device 106. As yet another alternative, the device may include only one border (e.g., a top border). Like the frame 108, borders may be defined by one or more pigment layers 116 (FIG. 1C).

Figure 1B:
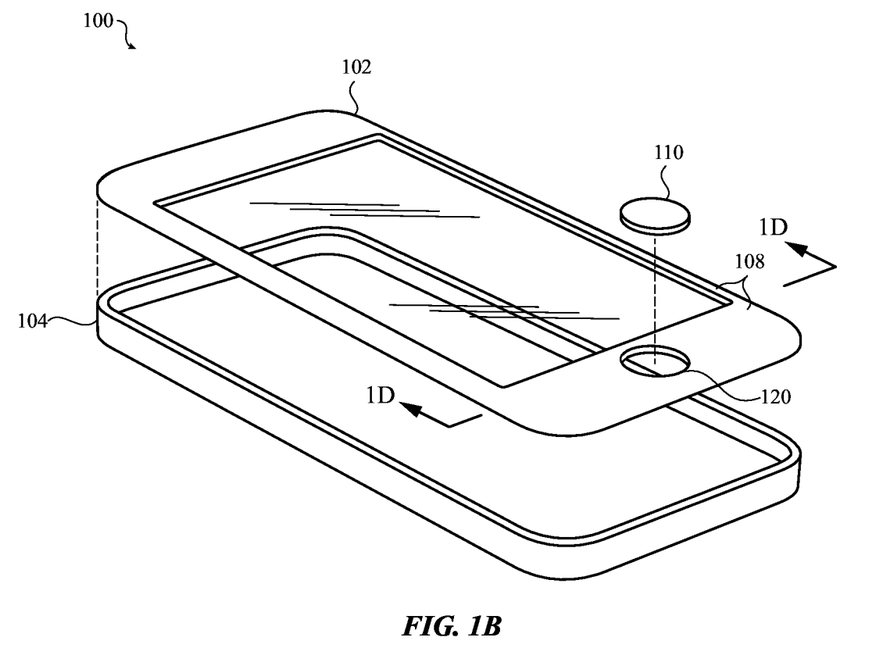
FIG. 1B shows an exploded view of the electronic device of FIG. 1A.

FIG. 1B illustrates the electronic device 100 with the cover glass assembly 102 removed from the housing 104. FIG. 1B also illustrates a button cover 110 that may be disposed within an aperture 120 in the cover glass assembly 102. For simplicity, components of the device 100 disposed in the housing 104 are omitted from FIG. 1B. However, it will be understood that the device 100 may include components such as displays (e.g., the display device 106), circuit boards, speakers, microphones, antennas, processors, input mechanisms, output devices, batteries, and the like, any of which may be partly or entirely within the housing.

Figure 1C:
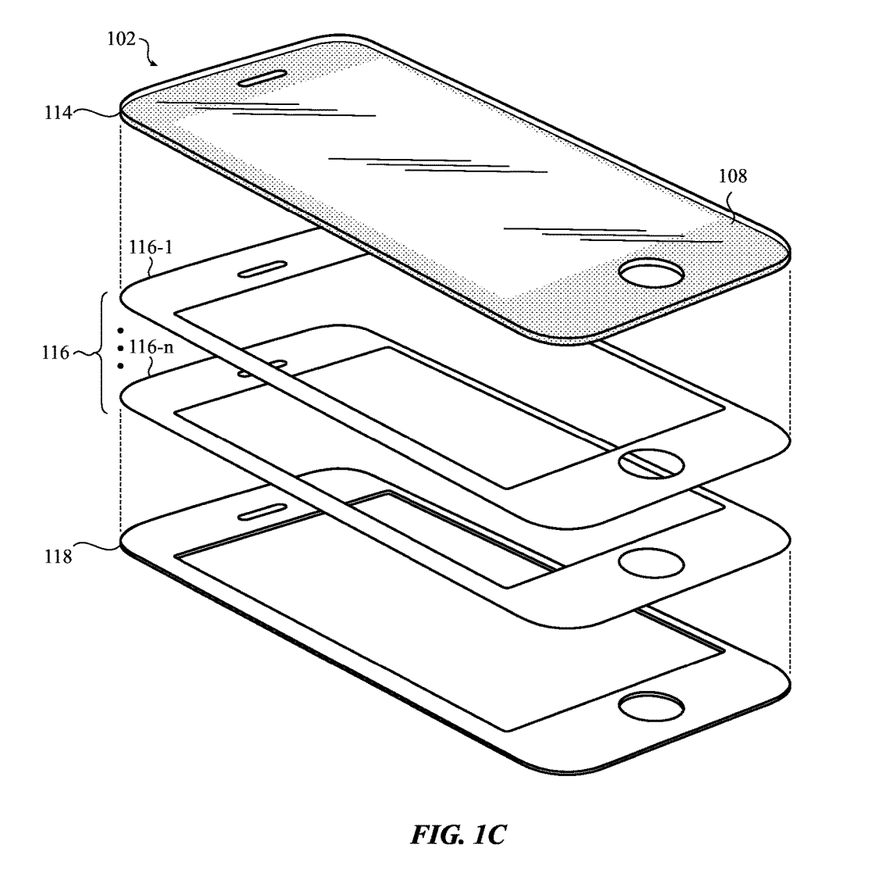
FIG. 1C shows an exploded view of an example of a cover glass assembly.

FIG. 1C is an exploded view of the cover glass assembly 102, according to some embodiments. The cover glass assembly 102 includes a first sheet 114, one or more pigment layers 116, and a base layer 118.

In some embodiments, a first surface of the first sheet 114 is an external surface of the device 100. The first sheet 114 also includes a second surface that is opposite the first surface, and that faces the interior of the device 100. In some embodiments, the cover glass assembly 102 includes other layers that are not shown, including adhesives, touch-sensitive films, polarizing films, filters, display components, or the like. Such layers are omitted from FIG. 1C for clarity, though they may be included in various embodiments.

The first sheet 114 may be formed from any appropriate material, including glass, chemically strengthened glass, polycarbonate, or sapphire. In some embodiments, the first sheet is textured in the area corresponding to the frame 108. As described with respect to FIGS. 2A-2B, this textured portion may diffusely reflect a portion of the light that enters the cover glass assembly 102, and diffusely transmit (onto the pigment layers 116) another portion of the light. "Diffuse reflection" refers to light that is scattered among many angles, rather than being reflected along a single angle, which is the case in specular reflection. Similarly, "diffuse transmission" refers to light that, as a result of passing through a material, is scattered among many angles, rather than a single angle. The diffuse reflection and transmission of the light caused by the textured surface increases the luminance of the cover glass assembly 102 as compared to non-textured surfaces.

The textured portion may be integrally formed with the first sheet 114. For example, in some embodiments, the textured portion is formed on the first sheet 114 using chemical etching, abrasive blasting, laser etching, mold etching, or the like. Thus, the textured portion of the first sheet 114 has a different surface than the rest of the first sheet 114, but is otherwise a single piece of material.

In some embodiments, a material is applied to the first sheet 114 in the area corresponding to the frame 108 to form a texture on the first sheet 114. The material may be applied using any appropriate technique, such as spraying, brushing, electroplating, physical vapor deposition, chemical vapor deposition, plasma enhanced chemical vapor deposition, and ion beam assisted deposition.

In some embodiments, the textured portion is (or is included in) a film that is disposed below the first sheet 114. For example, a film or sheet (not shown) of glass, polymer, sapphire, or the like having a textured portion corresponding to the frame 108 may be disposed below the first sheet 114. The film may be adhered, bonded, or otherwise coupled to the first sheet 114, or may not be fixedly attached to the first sheet 114. The film may have a shape corresponding to the frame 108 (e.g., the film may have an aperture that aligns with the display device 106). In other cases, the film may have the same or substantially the same size and topology as the first sheet 114.

The surface structure of the textured portion, whether the texture is integrally formed with the first sheet 114 or applied to the first sheet, may be any appropriate surface structure that diffusely reflects a portion of light that enters the first sheet 114, and/or diffusely transmits a portion of light that enters the first sheet 114. For example, the textured portion may be composed of a plurality of indentations, protrusions, or other surface irregularities. In some embodiments, the textured portion comprises a plurality of indentations having an average depth of between about 50-500 nanometers, and having a diameter (or other lateral dimension) of between about 1-10 microns. In other embodiments, the plurality of indentations may have average depths and/or diameters (or other lateral dimensions) of any appropriate value or falling within any appropriate range of values.

In some embodiments, the shape and/or dimensions of the features forming the textured portion are selected, at least in part, so that pigments, adhesives, or other coatings that are applied to the textured portion achieve a desired degree of wetting on the textured portion. For example, for more viscous coatings, indentations having larger diameters and/or shallower depths may be selected to ensure that the coating will flow into the indentations and completely or substantially completely wet the textured portion. In some cases, less than full wetting of the textured portion is desired, and the shape and/or dimensions of the features of the textured portion are selected such that air pockets or other voids exist between a coating and the textured portion.

Figure 1D:
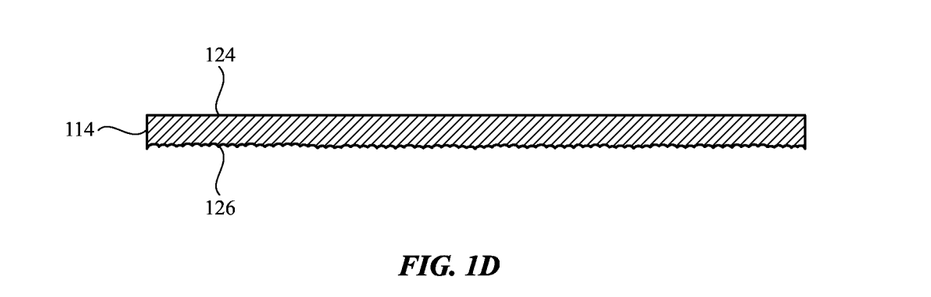
FIG. 1D shows a cross-sectional view of a first sheet of the cover glass assembly of FIG. 1A.

FIG. 1D is a magnified cross-section of a portion of the first sheet 114 taken across line 1D-1D in FIG. 1B, illustrating the surface irregularities of a textured portion of the first sheet 114. The first sheet 114 includes a first surface 124 and a second, textured surface 126. In some embodiments, the first surface is an outer surface of the device 100, such as the outer surface of a touch screen. In some embodiments, the second surface 126 is a bottom surface of the first sheet 114 that faces the interior of the device 100.

The texture of the second surface 126 may have any appropriate shape or pattern. For example, the texture may include indentations, protrusions, pyramids, wave profiles (e.g., sine waves, square waves, triangle waves), saw-tooth profiles, or any other surface irregularities that may be produced by a texturing process described herein. Additionally, the features forming the texture may be substantially random (e.g., as may result from abrasive blasting), or regular (e.g., as may result from laser-etching or molding a predefined pattern into the second surface 126).

It will be understood that the physical dimensions of the textured portion shown in FIG. 1D are merely illustrative. In particular, the shape and relative sizes of the indentations shown in FIG. 1D are not necessarily representative of indentations that result from a texturing process such as etching or abrasive blasting. Moreover, the indentations shown in FIG. 1D may be more or less uniform in size and/or shape than may be achieved with a texturing process. The particular size and/or shape of the surface irregularities that form the textured surface of the first sheet 114 may depend, at least in part, on the particular process used to form the textured surface.

The textured portion of the first sheet 114 diffusely reflects a portion of light that enters the first sheet 114 through an outer surface of the first sheet 114. For example, instead of allowing all or most of the light that enters the first sheet 114 to pass through and onto subsequent layers of the cover glass assembly 102, the textured portion reflects at least some of the light back through the outer surface. Moreover, because of the irregularity of the textured portion, the reflection is diffuse rather than specular. In other words, the light is reflected at many angles, rather than just one angle.

In addition to diffuse reflection, the textured portion diffusely transmits a portion of the light that enters the first sheet 114. For example, whereas a highly transparent, untextured material may allow light to pass through with little or no disturbance to the coherence and/or the angle of incidence of the light, the textured portion of the first sheet 114 may scatter exiting light in many different directions.

Figure 2A:
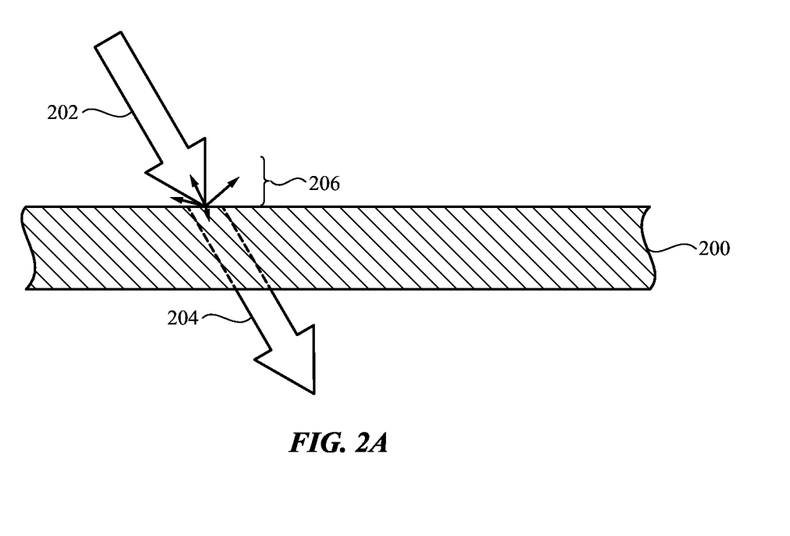
FIGS. 2A-2B show cross-sectional views of example first sheets of a cover glass assembly.
Figure 2B:
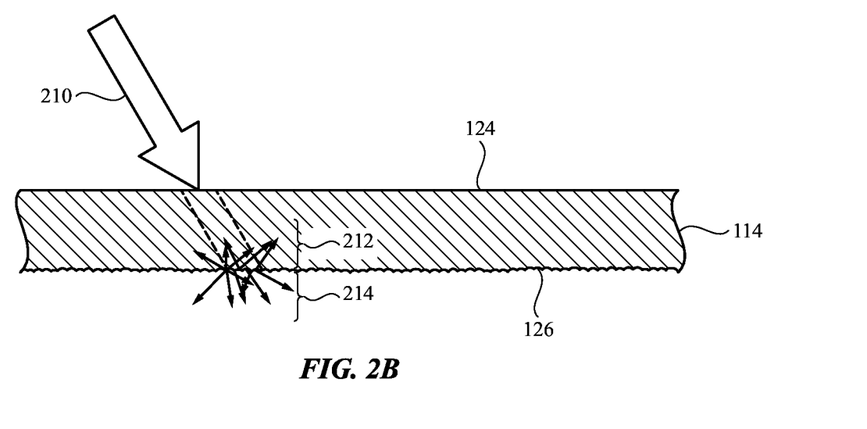

FIGS. 2A-2B illustrate the difference in light reflection and transmission between a sheet that has no textured portion and a sheet with a textured portion. FIG. 2A is a cross-section of a portion of a transparent first sheet 200 (analogous to the first sheet 114), corresponding to the line 1D-1D in FIG. 1B. In this instance, unlike the first sheet 114, the transparent first sheet 200 does not include a textured portion. Light 202 enters the transparent first sheet 200, and a large portion (in some cases, as much as 80-99%) of the light 202 passes through the transparent first sheet 200 without substantial change to the coherence or the angle of incidence of the light 202. The light that is not reflected is either absorbed or diffusely reflected by the transparent first sheet 200. The light that is transmitted through the transparent first sheet 200 is represented by arrow 204, and the light that is reflected is represented by arrow 206.

FIG. 2B is a cross-section of a portion of the first sheet 114, taken across line 1D-1D in FIG. 1B and illustrating the diffuse reflection and transmission that is caused by the textured portion of the first sheet 114. Light 210 enters the first sheet 114 through a first surface 124. Some of the light is diffusely reflected by the textured portion of the second surface 126, as represented by arrows 212. The textured portion diffusely transmits some of the light, as represented by arrows 214. The diffuse reflection and transmission of the light may increase the luminance of the first sheet 114 in the area of the textured portion in several ways. First, the textured portion of the second surface 126 reflects a portion of the incident light before it can even come in contact with the underlying layers of the cover glass assembly 102. Because the underlying layers, such as the pigment layers 116 and the base layer 118 (FIG. 1C), absorb (or otherwise do not reflect) some of the light that is incident upon those layers, the light that is diffusely reflected by the textured portion is not subject to such losses.

Second, the diffuse transmission of the light results in a reduction in the average angle of incidence of light on the underlying layers of the cover glass assembly 102. In particular, the one or more pigment layers 116, shown in FIG. 1C, may be more effective at reflecting light that has a shallower angle of incidence. By reducing the average angle of incidence of the light, the pigment layers are able to reflect more incident light, thus increasing the luminance of the surface.

Returning to FIG. 1C, the cover glass assembly 102 includes one or more pigment layers 116 below the first sheet 114 (and below the textured surface, whether it is formed into the first sheet 114 or applied to the first sheet 114 as a separate layer). For simplicity, the pigment layers 116 are shown and described as including multiple pigment sub-layers 116-1-116-n. In some embodiments, however, the pigment layers 116 include only a single layer or coating of pigment (e.g., pigment layer 116-1). In other embodiments, the pigment layers 116 include any number of pigment sub-layers, such as 2, 3, 4, 5, or more sub-layers.

The pigment layers 116 may be applied as multiple pigment sub-layers, but may become a single, monolithic pigment layer after the coating. For example, a subsequent pigment sub-layer may melt (e.g., due to a chemical solvent in the subsequent pigment sub-layer) into a previous pigment sub-layer, resulting in a single pigment layer without distinct discernible layers.

Positions of the pigment layers 116 may align with a position of the frame 108 of the device 100, and may act as an opaque coating to obscure objects and components within the device 100 that are below the frame 108. The color(s) of the pigment layers 116 determine the color of the frame 108. For example, if the plurality of pigment layers 116 is white, then the frame 108 may appear white. In some embodiments, the pigment layers 116 are all a single color. In some embodiments, different pigment layers 116 are different colors.

The pigment layers 116 may be any appropriate color. In some embodiments, one or more of the pigment layers 116 are white. White pigment layers may include a material such as titanium dioxide, antimony trioxide, barium sulfate, basic lead carbonate, zinc oxide, or the like.

The pigment layers 116 may be any appropriate material or combination of materials. For example, the pigment layers 116 may include inks, dyes, paints, powder coatings, or other material that is sprayed, deposited, coated, or otherwise applied to a layer of the cover glass assembly 102. In such cases, a first pigment layer may be coated onto the first sheet 114, and subsequent pigment layers may then be coated onto the first pigment layer. Where material is coated onto the first sheet 114 to form the pigment layers 116, the first sheet 114 may be masked to prevent the coating from adhering to or contacting one or more portions of the first sheet 114. For example, a mask may be applied to an area of the first sheet 114 that is configured to cover the display device 106 of the device 100. After coating the first sheet 114, the masking may be removed to reveal an uncoated display area.

The pigment layers 116 can be sheets or films of material (e.g., polymer, glass, or sapphire sheets) that are pre-coated or impregnated with paint, dye, pigment, or other material. Such sheets or films may be adhered or bonded to another layer of the cover glass assembly 102, such as with an adhesive. The sheets or films may have a shape corresponding to the frame 108 (e.g., the sheet or film may have an aperture that is configured to align with the display device 106). In other cases, the sheet or film may have the same or substantially the same size and topology as the first sheet 114 (e.g., the sheet or film has a frame portion 108 that includes a pigment, as well as a substantially transparent portion that is configured to align with the display device 106).

Different pigment layers 116 may have different optical properties. For example, each pigment layer may exhibit a different reflective spectral response, where a reflective spectral response refers to the efficiency at which a pigment layer reflects different wavelengths of light. For example, a first pigment layer may reflect light having a certain spectral content more efficiently than a second pigment layer. Accordingly, layers that are more efficient at reflecting deeply penetrating wavelengths of light may be located below layers that are more efficient at reflecting shallowly penetrating wavelengths of light. The properties (e.g., the wavelength) of the light reflected by a given pigment layer may depend, in part, on the size of the pigment particles in that layer.

Returning to FIG. 1C, the cover glass assembly 102 includes a base layer 118, which may be an opaque material. In some cases, the pigment layers 116 are not entirely opaque and thus allow a portion of the light that is incident thereon to pass through the pigment layers 116 and onto a lower layer of the cover glass assembly 102. Accordingly, if an opaque base layer 118 is not provided below the pigment layers 116, a user may be able to see outlines of components or other irregularities that underlie the frame 108. Additionally, light emitted from components within the housing 104 may be visible through the cover glass assembly. Thus, the opaque base layer 118 results in an opaque cover glass assembly 102.

The base layer 118 may be non-mirrored or mirrored. A non-mirrored base layer 118 may absorb light that passes through the pigment layers 116. The non-mirrored base layer 118 may be a layer of grey or black material (e.g., paint, dye, or ink coated applied to the bottom pigment layer, or a grey or black film disposed below the bottom pigment layer). While a grey or black material will absorb much of the light that is incident upon the material, and thus may reduce the luminance of the pigment layers 116, the grey or black material may not impart a color or hue to the pigment layers 116 (though it may darken the appearance of the pigment layers 116). Thus, for example, if the pigment layers 116 are white, the frame 108 will appear white even though the underlying base layer 118 is grey or black.

Figure 3A:
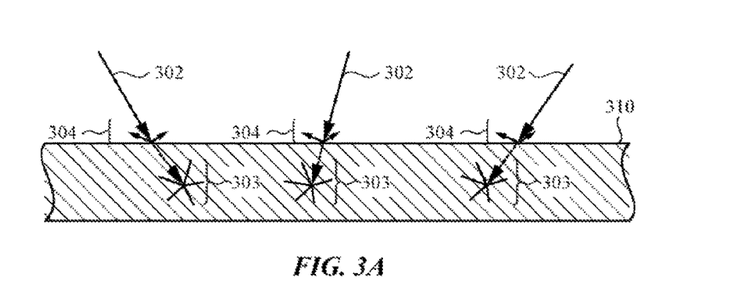
FIGS. 3A-3C show cross-sectional views of example base layers of a cover glass assembly.

FIG. 3A is a cross-section of a portion of a non-mirrored layer 310, which may be used as the base layer 118, taken across line 1D-1D in FIG. 1B. Light 302 represents light that passes through the pigment layers 116 and onto the non-mirrored layer 118-1. (The pigment layers 116 may diffuse the light that is transmitted therethrough, as described above, so light 302 includes multiple light paths having several different angles of incidence.) The substantially non-mirrored layer 118-1 absorbs most of the light 302 and reflects only a fraction of the light 302 back into the pigment layers 116. The absorbed light is illustrated by lines 303 and the reflected light is illustrated by arrows 304.

On the other hand, the base layer 118 may be mirrored such that at least a portion of the light that is transmitted through the pigment layers 116 is reflected onto the pigment layers 116. By redirecting the light onto the pigment layers 116, rather than absorbing the light, a mirrored base layer may increase the luminance of the frame 108 as compared to a non-mirrored base layer. In particular, the light absorbed by a non-mirrored layer is not returned through the pigment layers 116 and the first sheet 114, and, therefore, does not contribute to the luminance of the frame 108. By reflecting light back into the pigment layers 116, however, a mirror layer reduces the light lost through absorption (or lost by passing through the cover glass assembly 102 and into the housing interior), and thus increases the luminance of the frame 108.

Figure 3B:
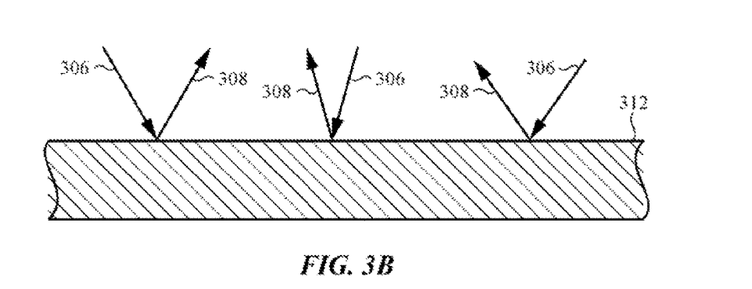

FIG. 3B is a cross-section of a portion of a mirror layer 312, which may be used as the base layer 118, taken across line 1D-1D in FIG. 1B. Light 306 represents light that passes through the pigment layers 116 and onto the mirror layer 312. The mirror layer 312 reflects most of the light 306 back into the pigment layers 116, at least a portion of which may then be transmitted back through the pigment layers 116 and through the first sheet 114. Arrows 308 represent the light reflected by the mirror layer 312. This reflected light increases the overall percentage of the light that is reflected by the cover glass assembly 102 in the area of the frame 108, and thus increases the luminance of the frame 108.

The mirror layer 312 may specularly reflect light into the pigment layers 116. Specular reflection may increase the luminance of the cover glass assembly 102, because a high percentage of incident light is reflected back onto the pigment layers 116. In other words, specular reflection reflects most of the incident light directly back onto the pigment layers 116, reducing losses (e.g., from light being absorbed into an opaque layer) and increasing the luminance. Moreover, while specular reflections may result in visible images on the mirror layer 312, the pigment layers 116 disposed above the mirror layer 312 diffuse the light reflected from the mirror layer 312 and transmitted through the first sheet 114, thus eliminating any undesirable reflections from the mirror layer 312.

In some embodiments, the mirror layer 312 is formed by coating or depositing a reflective material onto the underside of the pigment layers 116, or onto a film that is disposed below the pigment layers 116. Reflective material may be coated or deposited in any appropriate manner, including, without limitation, spraying, brushing, electroplating, physical vapor deposition, chemical vapor deposition, plasma enhanced chemical vapor deposition, and ion beam assisted deposition. In some embodiments, the reflective material is conductive; in some embodiments, it is non-conductive.

The mirror layer 312 may include one mirrored layer or a group of mirrored layers disposed below the pigment layers 116 (not shown). The group of mirrored layers looks similar to that shown in FIG. 10 for a group of pigment layers 116-1 . . . 116-n. The mirrored layer(s) may be adhered or otherwise coupled to the first sheet 114 (e.g., to the pigment layers 116). Alternatively, the mirrored layer(s) may be disposed below but not coupled to the first sheet 114. Where the mirror layer 312 includes multiple mirrored layers, the layers may include multiple layers of dielectric material. Alternatively or additionally, the layers may include multiple polymer films, some or all of which may be reflective or coated with reflective material.

Figure 3C:
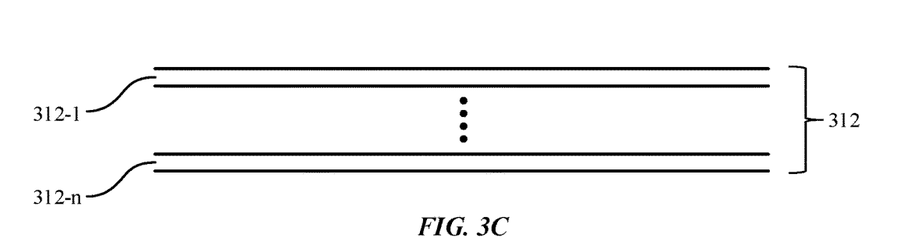

In some embodiments, the mirror layer 312 is a mirrored film (which may include multiple sub-layers 312-1, . . . 312-n, as shown in FIG. 3C). A mirrored film may have a mirrored portion and an un-mirrored (e.g., transparent) portion. For example, a film may be mirrored in an area corresponding to the frame 108, and transparent in an area corresponding to the display device 106. In some embodiments, the mirrored film may include one or more apertures, such as apertures corresponding to apertures in the cover glass assembly 102 (e.g., an aperture in which the button cover 110 is received, FIG. 1B). In some embodiments, the mirrored film includes an aperture in the area corresponding to the display device 106.

The mirror layer 312 may reflect all (or substantially all) of the light that is incident thereon, or it may reflect only a portion of the incident light. Moreover, the mirror layer 312 may reflect light having only particular spectral content. For example, the mirror layer 312 may reflect blue light, while absorbing or transmitting light of other colors. Accordingly, where the mirror layer 312 includes a mirrored film, the mirror layer 312 may be selected so that light of a particular spectral content is reflected into the pigment layers 116. The reflected light may span a continuous spectral range (e.g., about 450-500 nm wavelength light), or may span multiple discontinuous spectral ranges (e.g., about 450-500 nm and about 650-700 nm wavelength light). In some embodiments, the mirror layer 312 may include multiple reflective layers. In such cases, each layer may reflect light having particular spectral content. For example, a first layer may reflect light having wavelengths in the range of about 450-500 nm, and a second layer may reflect light having wavelengths in the range of about 650-700 nm. The spectral ranges set forth above are examples, and other spectral ranges may be used instead or in addition to those listed.

In some embodiments, the particular spectral range(s) reflected by the mirror layer 312 are selected based on the spectral content of the light that is transmitted by the pigment layers 116. For example, white pigments, dyes, and the like, may reflect disproportionately more blue light than orange light, thus imparting a blue tint to the pigment layers 116. Accordingly, in some embodiments, the mirror layer 312 reflects substantially only orange light (or that reflect all light except blue light) in order to counteract the blue tint of the pigment layers 116, and thus produce a more purely white color.

In some embodiments, the thickness of the cover glass assembly 102 may be reduced by using a mirror layer 312 that reflects less than the entire spectrum of visible light. For example, a mirror layer 312 may require multiple layers of reflective material in order to reflect the full spectrum of visible light reasonably equally. However, because the pigment layers 116 only transmit light having a limited spectral content onto the mirror layer 312, some of the reflective capability of the mirror layer 312 is unused. Thus, by omitting layers that reflect light that is blocked by the pigment layers 116, the mirror layer 312 may be made thinner without significant loss of luminance.

Figure 4:
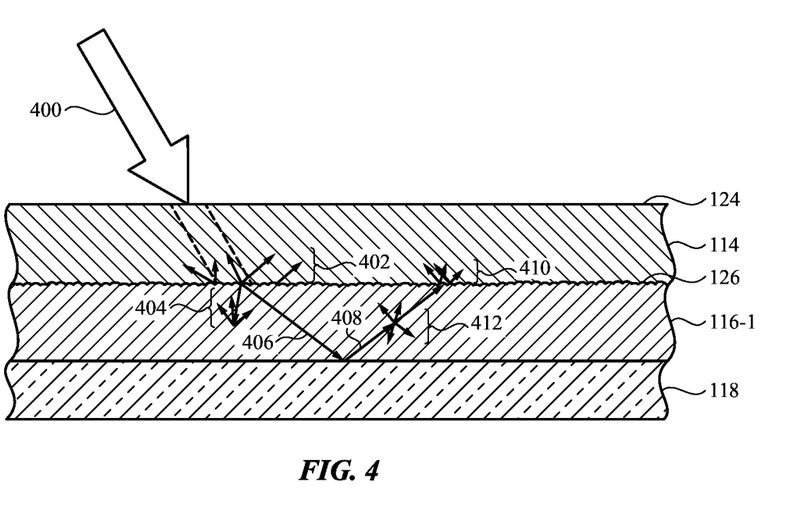
FIG. 4 shows a cross-sectional view of an example of a cover glass assembly.

FIG. 4 is a cross-section of a portion of the cover glass assembly 102, taken across line 1D-1D in FIG. 1B. The cover glass assembly 102 in FIG. 4 includes a first sheet 114, a pigment layer 116-1, and a mirrored base layer 118. The first sheet 114 includes a textured second surface 126 (e.g., as shown and described with respect to FIG. 2B). Exemplary materials and configurations for the first sheet 114, the pigment layer 116-1, and the base layer 118 are discussed herein. FIG. 4 includes only one pigment layer 116-1, but other embodiments may include multiple pigment layers.

The arrows in FIG. 4 illustrate exemplary light paths through a cover glass assembly 102 that includes a textured portion on the second surface 126 on the first sheet 114, as well as a mirrored base layer 118. Light 400 enters the first sheet 114 through the first surface 124. Some of the light 400 is diffusely reflected by the textured portion of the second surface 126, as represented by arrows 402. Arrows 402 also represent light that passes through the textured portion of the second surface 126 and is reflected by the top surface of the pigment layer 116-1. Some or all of the diffusely reflected light 404 is transmitted back through the first sheet 114 and out of the cover glass assembly 102, contributing to the luminance of the cover glass assembly 102.

Some of the light 400 entering the first sheet 114 is diffusely transmitted through the textured portion of the second surface 126 into the pigment layer 116-1. Some of the light that is diffusely transmitted into the pigment layer 116-1 is diffusely reflected by the pigment layer 116-1, as represented by arrows 404. The light represented by arrows 404 may ultimately be transmitted back through the first sheet 114 and out of the cover glass assembly 102, contributing to the luminance of the cover glass assembly 102.

Some of the light that is transmitted into the pigment layer 116-1 will pass through the pigment layer 116-1 and onto the mirrored base layer 118. In particular, arrow 406 represents light passing through the pigment layer 116-1. While shown as a single arrow 406, this light may not take a direct path through the pigment layer 116-1. Rather, the light represented by arrow 406 may have been diffused (or otherwise deflected or interfered with) by the pigment layer 116-1.

Arrow 408 represents light from arrow 406 that is reflected off of the mirrored base layer 118. Some or all of the light 408 may be diffusely reflected by pigment layer 116-1, as shown by arrows 412. At least some of this diffused light may pass through the pigment layer 116-1, into the first sheet 114, and out of the cover glass assembly 102. Light that is reflected by the pigment layer 116-1 and/or the mirrored base layer 118 may be diffused by the textured portion of the second surface 126 when the reflected light reaches the interface between the pigment layer 116-1 and the first sheet 114. For example, arrows 410 represent diffuse transmission of light that is reflected by the mirrored based layer 118 and into the pigment layer 116-1. It will be understood that any light that passes from the pigment layer 116-1 and through the textured portion of the second surface 126 may be similarly diffused, regardless of the particular path of the light through the pigment layer 116-1.

Figure 5:
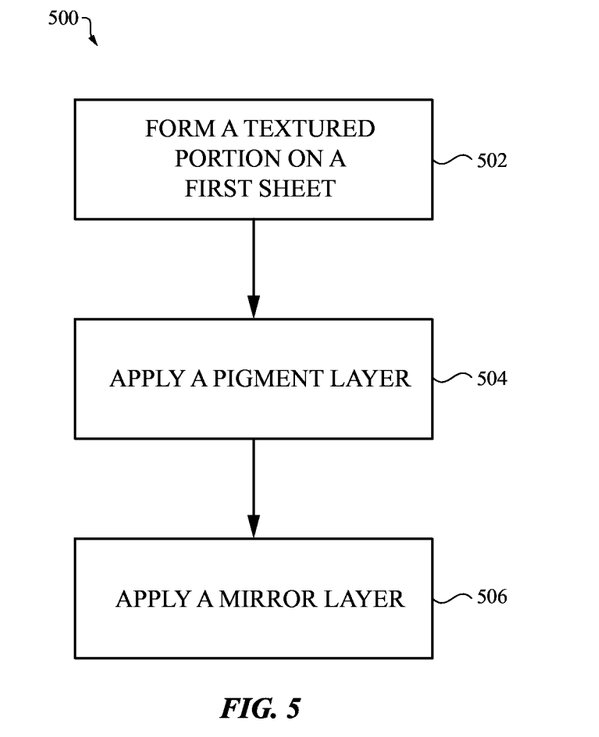
FIG. 5 shows an example process for forming a cover glass assembly.

FIG. 5 depicts a flow chart of a method 500 of forming a cover glass assembly, such as the cover glass assembly 102. In some embodiments, a cover glass formed as a result of the method 500 is used to cover at least a display and/or touch-sensitive input region of an electronic device. In some cases, the method 500 may be used to form a structure for any use or purpose. For example, a structure produced in accordance with the method 500 may be used as a covering for a mirror, a watch crystal, a window, a lens, or the like.

At operation 502, a textured portion is formed on a bottom surface of a sheet. The sheet may be any appropriate material, including sapphire, glass, chemically strengthened glass, polycarbonate, or the like. In some embodiments, the textured portion corresponds to a frame portion of a cover glass assembly of an electronic device (e.g., the frame 108). The textured portion may diffusely reflect a portion of light that enters the cover glass assembly, and diffusely transmit another portion of the light that enters the cover glass assembly. In some embodiments, the diffuse reflection and transmission caused by the textured portion produces a high-luminance surface of the cover glass assembly.

In some embodiments, forming the textured portion includes etching the portion of the sheet that corresponds to the frame portion of the cover glass assembly. Etching may include any appropriate etching operation, including abrasive blasting (e.g., sand or bead blasting), laser etching, mold etching, or chemical etching.

In some embodiments, forming the textured portion includes applying a material to the portion corresponding to the frame portion of the cover glass assembly. For example, a layer of a material (e.g., polymer, glass, or sapphire) may include a textured surface or structure, and the layer may be applied to the sheet, or otherwise disposed below the sheet. As another example, one or more layers of material may be deposited on the sheet in order to produce a textured surface. Techniques for depositing material include spraying, brushing, electroplating, physical vapor deposition, chemical vapor deposition, plasma enhanced chemical vapor deposition, and ion beam assisted deposition At operation 504, a pigment layer is applied to the textured portion of the sheet. In some embodiments, applying the pigment layer includes applying a plurality of pigment sub-layers. The pigment layer or sub-layers may be applied in any appropriate manner. For example, the pigment layer or sub-layers may be sprayed, brushed, electroplated, or deposited (e.g., via physical vapor deposition, chemical vapor deposition, plasma enhanced chemical vapor deposition, or ion beam assisted deposition) onto the textured portion of the sheet.

In some embodiments, applying the pigment layer includes disposing a sheet or film of material below the sheet. For example, a sheet or film of material (e.g., polymer, glass, or sapphire sheets) may be pre-coated or impregnated with paint, dye, or other pigment. The pigmented sheets or films may then be adhered or bonded to the sheet, such as with an adhesive. Alternatively, the pigmented sheets or films may be disposed below the sheet without being adhered or bonded to another sheet. As yet another alternative, the pigmented sheets or films may be bonded to a base sheet.

In operation 506, a mirror layer is applied to the pigment layer. In some embodiments, applying the mirror layer includes applying a multilayer polymer sheet to the pigment layer. In some embodiments, the multilayer polymer sheet is adhered or bonded to the pigment layer, such as with an adhesive.

In some embodiments, applying the mirror layer includes applying one or more mirror layers via spraying, brushing, electroplating, physical vapor deposition, chemical vapor deposition, plasma enhanced chemical vapor deposition, or ion beam assisted deposition.

While any methods disclosed herein have been described and shown with reference to particular operations performed in a particular order, it will be understood that these operations may be combined, sub-divided, or re-ordered to form equivalent methods without departing from the teachings of the present disclosure. Accordingly, unless specifically indicated herein, the order and grouping of the operations is not a limitation of the present disclosure.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A cover glass assembly, comprising a structure consisting of:
    a sheet comprising a first surface and a second textured surface opposite to the first surface; and
    a pigment layer disposed below the second textured surface, wherein:
        the second textured surface diffusely reflects a first portion of light entering the sheet through the first surface; and
        the second textured surface diffusely transmits, onto the pigment layer, a second portion of the light; and
    a continuous mirror layer comprising a dielectric material disposed below the pigment layer.

2. The cover glass assembly of claim 1, wherein the second textured surface diffusely transmits the second portion of the light and reduces the average angle of incidence of at least some of the second portion of the light onto the pigment layer.

3. The cover glass assembly of claim 1, wherein the pigment layer reflects at least some of the second portion of the light that is diffusely transmitted by the second textured surface.

4. The cover glass assembly of claim 1, wherein the pigment layer comprises a film on the second textured surface of the sheet.

5. The cover glass assembly of claim 1, wherein:
    the sheet further comprises a substantially transparent portion that is configured to cover a display of an electronic device; and
    the second textured surface is aligned with a frame portion of the cover glass assembly.

6. The cover glass assembly of claim 1, wherein the second textured surface comprises a plurality of indentations having an average depth of between about 50-500 nanometers and an average diameter of between about 1-10 microns.

7. An electronic device, comprising:
    a housing;
    a display device at least partially within the housing;
    a cover glass assembly according to claim 1, coupled to the housing; and the textured portion corresponds to a frame portion of the cover glass assembly.

8. A cover glass, comprising a structure consisting of:
a transparent layer having a textured region adjacent to and framing the transparent layer;
a pigment layer disposed below the textured region; and
a continuous mirror layer comprising a multilayer polymer sheet disposed below the pigment layer.

9. The cover glass of claim 8, wherein:
the pigment layer comprises a plurality of pigment coatings; and
the continuous mirror layer comprises one or more mirror coatings disposed below the pigment layer.

10. The cover glass of claim 8, wherein the pigment layer is an ink comprising titanium dioxide.

11. The cover glass of claim 8, wherein:
the pigment layer reflects light having a first spectral content and transmits light having a second spectral content different from the first spectral content; and
the continuous mirror layer reflects light having the second spectral content.

12. The cover glass of claim 11, wherein the second spectral content is less than the entire spectrum of visible light.

13. The cover glass of claim 11, wherein:
the continuous mirror layer comprises a plurality of mirror sub-layers; and
respective mirror sub-layers reflect light of different respective spectral content.

14. A method of forming a cover glass assembly, the cover glass assembly comprising a structure consisting of a sheet, a pigment layer and a continuous mirror layer, the method comprising:

forming a textured portion on a bottom surface of the sheet, the textured portion corresponding to a frame portion of the cover glass assembly;
applying the pigment layer to the textured portion of the sheet; and
applying the continuous mirror layer to the pigment layer;
wherein the textured portion is configured to diffusely reflect a portion of light that enters the cover glass assembly through the sheet, to form the structure consisting of the sheet.

15. The method of claim 14, wherein applying the pigment layer includes applying a plurality of pigment sub-layers.

16. The method of claim 14, wherein applying the pigment layer comprises applying the pigment layer via spraying, brushing, electroplating, physical vapor deposition, chemical vapor deposition, plasma enhanced chemical vapor deposition, or ion beam assisted deposition.

17. The method of claim 14, wherein applying the continuous mirror layer comprises applying a multilayer polymer sheet to the pigment layer.

18. The method of claim 14, wherein applying the continuous mirror layer comprises applying the continuous mirror layer via spraying, brushing, electroplating, physical vapor deposition, chemical vapor deposition, plasma enhanced chemical vapor deposition, or ion beam assisted deposition.

19. The method of claim 14, wherein forming the textured portion comprises etching a portion of the sheet that corresponds to the frame portion using one or more of abrasive blasting, laser etching, mold etching, or chemical etching.

* * * * *